(12) United States Patent
Valencic et al.

(10) Patent No.: US 11,360,131 B2
(45) Date of Patent: *Jun. 14, 2022

(54) METHODS AND APPARATUS TO DETERMINE AN OPERATIONAL STATUS OF A DEVICE

(71) Applicant: The Nielsen Company (US), LLC, New York, NY (US)

(72) Inventors: Bostjan Valencic, Koper (SI); Igor Sotosek, Portoroz (SI)

(73) Assignee: The Nielsen Company (US), LLC, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/933,938

(22) Filed: Jul. 20, 2020

(65) Prior Publication Data

US 2020/0348344 A1 Nov. 5, 2020

Related U.S. Application Data

(63) Continuation of application No. 15/721,432, filed on Sep. 29, 2017, now Pat. No. 10,718,799, which is a
(Continued)

(51) Int. Cl.
*G01R 21/00* (2006.01)
*G01R 19/00* (2006.01)
(Continued)

(52) U.S. Cl.
CPC ......... *G01R 21/00* (2013.01); *G01R 19/0092* (2013.01); *G01R 21/133* (2013.01); *G01R 33/02* (2013.01)

(58) Field of Classification Search
None
See application file for complete search history.

(56) References Cited

U.S. PATENT DOCUMENTS

| 1,666,309 A | 4/1928 | Ray |
| 3,315,160 A | 4/1967 | Goodman |

(Continued)

FOREIGN PATENT DOCUMENTS

| EP | 2660611 | 11/2013 |
| WO | 2012030016 | 3/2012 |

OTHER PUBLICATIONS

International Searching Authority, "International Search Report and Written Opinion", issued in connection with International Patent Application No. PCT/US2014/066933, dated Feb. 13, 2015, 11 pages.

(Continued)

*Primary Examiner* — Douglas X Rodriguez
(74) *Attorney, Agent, or Firm* — Hanley, Flight & Zimmerman, LLC

(57) ABSTRACT

Methods, apparatus, systems and tangible computer readable storage media are disclosed to determine an operational status of a device. Disclosed example apparatus include a first sensor to be positioned a first distance from a wire to measure a first magnetic field associated with the wire, and a second sensor to be positioned a second distance, greater than the first distance, from the wire to measure a second magnetic field, the second distance to reduce detectability of the first magnetic field by the second sensor. Disclosed example apparatus further include a comparator to compare the first magnetic field and the second magnetic field to determine an operational status of the device, and a meter to collect audience measurement data based at least in part on the operational status of the device.

20 Claims, 12 Drawing Sheets

Related U.S. Application Data continuation of application No. 14/148,278, filed on Jan. 6, 2014, now Pat. No. 9,784,774.

(51) Int. Cl.
  *G01R 33/02* (2006.01)
  *G01R 21/133* (2006.01)

(56) References Cited

U.S. PATENT DOCUMENTS

| | | | |
|---|---|---|---|
| 4,172,235 | A | 10/1979 | Kohler |
| 4,723,302 | A | 2/1988 | Fulmer et al. |
| 4,764,808 | A | 8/1988 | Solar |
| 4,847,685 | A | 7/1989 | Gall et al. |
| 4,930,011 | A | 5/1990 | Kiewit |
| 5,315,236 | A | 5/1994 | Lee |
| 5,589,764 | A | 12/1996 | Lee |
| 5,659,367 | A | 8/1997 | Yuen |
| 5,889,548 | A | 3/1999 | Chan |
| 6,078,257 | A | 6/2000 | Ferraro |
| 6,467,089 | B1 | 10/2002 | Aust et al. |
| 6,681,396 | B1 | 1/2004 | Bates et al. |
| 7,100,181 | B2 | 8/2006 | Srinivasan et al. |
| 7,873,529 | B2 | 1/2011 | Kruger et al. |
| 7,882,514 | B2 | 2/2011 | Nielsen et al. |
| 7,987,071 | B1 | 7/2011 | Dorfman et al. |
| 8,450,995 | B2 * | 5/2013 | Wagner .......... G01D 4/008 324/142 |
| 8,784,207 | B2 * | 7/2014 | Ramaswamy ...... A63F 13/02 463/37 |
| 8,972,211 | B2 | 3/2015 | Yogeeswaran et al. |
| 9,784,774 | B2 | 10/2017 | Valencie et al. |
| 2002/0083435 | A1 | 6/2002 | Blasko et al. |
| 2005/0156587 | A1 | 7/2005 | Yakymyshyn et al. |
| 2006/0109384 | A1 | 5/2006 | Miller-Smith et al. |
| 2006/0186881 | A1 | 8/2006 | Tilbrook |
| 2007/0108988 | A1 | 5/2007 | Konno |
| 2008/0148307 | A1 | 6/2008 | Nielsen et al. |
| 2011/0121955 | A1 | 5/2011 | Qin |
| 2011/0153391 | A1 | 6/2011 | Tenbrock |
| 2011/0184560 | A1 | 7/2011 | Brickell et al. |
| 2012/0072143 | A1 | 3/2012 | Yogeeswaran et al. |
| 2012/0169328 | A1 | 7/2012 | Williams |
| 2012/0187943 | A1 | 7/2012 | Ausserlechner et al. |
| 2012/0229128 | A1 | 9/2012 | Satz |
| 2012/0262151 | A1 | 10/2012 | Mandic et al. |
| 2013/0215006 | A1 | 8/2013 | Liss et al. |
| 2013/0249531 | A1 | 9/2013 | Aratono et al. |
| 2013/0285825 | A1 | 10/2013 | Peczalski |
| 2014/0176126 | A1 | 6/2014 | Friedrich et al. |
| 2014/0225603 | A1 | 8/2014 | Auguste et al. |
| 2015/0042320 | A1 | 2/2015 | Cadugan et al. |
| 2015/0192624 | A1 | 7/2015 | Valencic et al. |

OTHER PUBLICATIONS

International Searching Authority, "International Preliminary Report on Patentability", issued in connection with International Patent Application No. PCT/US2014/066933, dated Jul. 12, 2016, 7 pages.
United States Patent and Trademark Office, "Non-Final Office Action," issued in connection with U.S. Appl. No. 14/148,278, dated Mar. 14, 2016, 60 pages.
United States Patent and Trademark Office, "Final Office Action," issued in connection with U.S. Appl. No. 14/148,278, dated Sep. 2, 2016, 24 pages.
United States Patent and Trademark Office, "Non-Final Office Action," issued in connection with U.S. Appl. No. 14/148,278, dated Apr. 3, 2017, 22 pages.
United States Patent and Trademark Office, "Notice of Allowance," issued in connection with U.S. Appl. No. 14/148,278, dated Jun. 1, 2017, 16 pages.
United States Patent and Trademark Office, "Non-Final Office Action," issued in connection with U.S. Appl. No. 15/721,432, dated May 5, 2019, 43 pages.
United States Patent and Trademark Office, "Final Office Action," issued in connection with U.S. Appl. No. 15/721,432, dated Jul. 2, 2019, 26 pages.
United States Patent and Trademark Office, "Final Office Action," issued in connection with U.S. Appl. No. 15/721,432, dated Nov. 20, 2019, 10 pages.
United States Patent and Trademark Office, "Notice of Allowance and Fee(s) Due," issued in connection with U.S. Appl. No. 15/721,432, dated Mar. 6, 2020, 17 pages.

* cited by examiner

US 11,360,131 B2

METHODS AND APPARATUS TO DETERMINE AN OPERATIONAL STATUS OF A DEVICE

CROSS REFERENCE TO RELATED APPLICATIONS

This patent arises from a continuation of U.S. patent application Ser. No. 15/721,432, filed Sep. 29, 2017, now U.S. patent Ser. No. 10,718,799, which is a continuation of U.S. patent application Ser. No. 14/148,278, filed Jan. 6, 2014, now U.S. Pat. No. 9,784,774. U.S. patent application Ser. No. 14/148,278 and U.S. patent application Ser. No. 15/721,432 are hereby incorporated herein by reference in their entireties.

FIELD OF THE DISCLOSURE

This disclosure relates generally to audience measurement, and, more particularly, to determining an operational status of a device.

BACKGROUND

Audience measurement of media, such as content, advertisements, etc. presented via a computer, tablet, smartphone, television and/or radio, is often carried out by monitoring media exposure of panelists that are statistically selected to represent particular demographic groups. Audience measurement companies, such as The Nielsen Company (US), LLC, enroll households and/or persons to participate in measurement panels. By enrolling in these measurement panels, the households and/or persons agree to allow the corresponding audience measurement company to monitor their exposure to media presentations, such as media output via a television, a radio, a computer, etc. Using various statistical methods, the media exposure data collected from the panel is processed to determine the size and/or demographic composition of the audience for media of interest. The audience size and/or demographic information is/are valuable to, for example, advertisers, broadcasters, content providers, manufacturers, retailers, product developers, etc. For example, audience size and/or audience demographic composition information may be a factor in the placement of advertisements, in valuing commercial time slots during particular programs and/or generating ratings for media.

DETAILED DESCRIPTION

When conducting audience measurement studies it may be useful to monitor the operational status of, for example, a media presentation device. For example a set-top box outputs media regardless of the operational status of a connected television, it may be useful to detect the operational status of the television to determine whether the media output by the set-top box is actually being presented, and thus, likely exposed to an audience. The operational status of an electric device may be detected by monitoring for electric current in a power cord connected to the device. Electric current flowing through a conductor induces a magnetic field. Detection and/or measurement of the magnetic field may be used to determine an operational status (e.g., an on/off state, an operating mode, etc.) of a device drawing the electric current (e.g., via a power cord). For example, when a power cord connected to a device is plugged into a power source (e.g., an electrical outlet providing 120 V AC) and the device is powered on, the device draws electric current from the power source through the power cord inducing a magnetic field around the power cord. Accordingly, it can be inferred that the device is powered on when a magnetic field caused by the electric current is measured in the vicinity of the power cord and/or in the vicinity of the device. On the other hand, it can be inferred that the device is powered off when a magnetic field expected to be caused by the electric current is not detected and/or not measured to have an expected magnitude (e.g., a threshold magnitude) in the vicinity of the power cord and/or in the vicinity of the device. Based on the operational status, an audience measurement entity may determine when and/or whether an audience measurement should be made. For example, an operational status may indicate that a media presentation device is powered on and therefore presumed to be presenting media.

Example methods, apparatus, and/or articles of manufacture disclosed herein utilize a multi-dimensional power detector to detect a magnetic field and determine an operational status of a device. An example multi-dimensional power detector disclosed herein detects components of a magnetic field near a wire in three dimensions. The example power detector determines if a resulting magnitude of the magnetic field exceeds a threshold to determine if electricity is flowing in the wire. Based on the determination of flowing electricity, the example power detector determines an operational status of a device attached to the wire (e.g., a television or other media presentation device).

Figure 1:
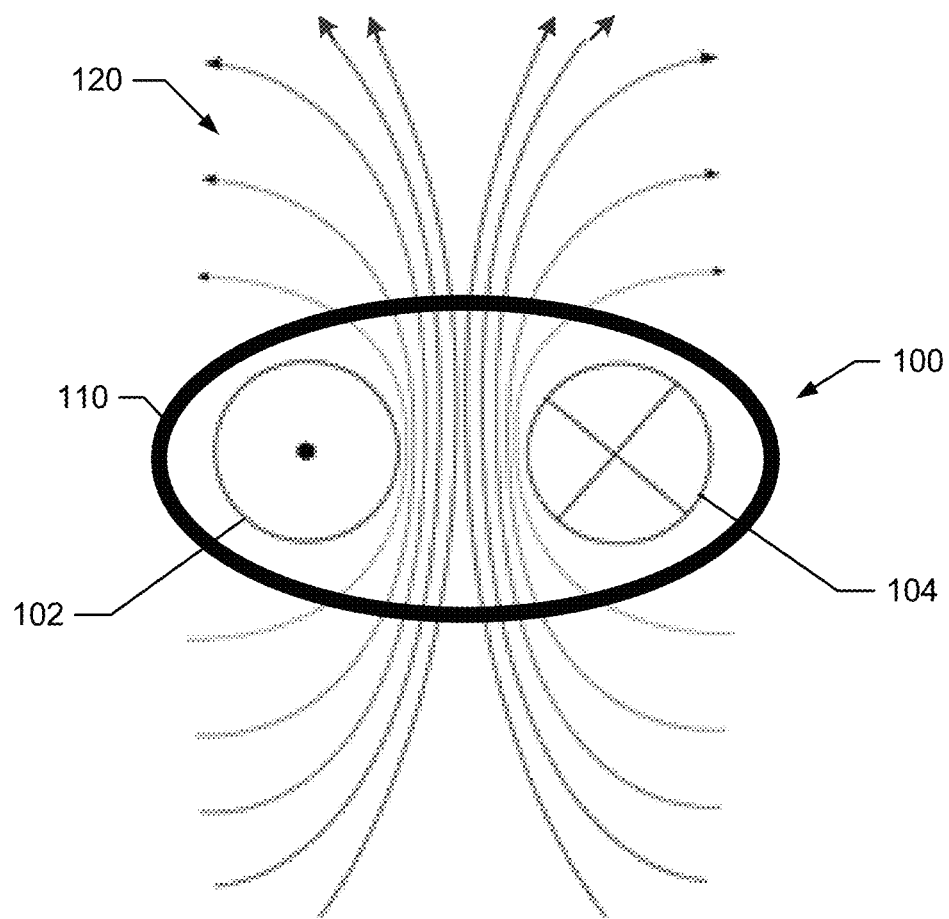
FIG. 1 is an axial view of an example power cord and an example magnetic field caused by electric current in the power cord.

FIG. 1 is an axial view of an example power cord 100. In examples disclosed herein, the power cord 100 supplies electricity to an example electronic device (e.g., a television, set top box, a game console, etc.). The example power cord 100 includes a first wire 102 and a second wire 104. In the example of FIG. 1, the wires 102, 104 (e.g., conductors) are conductively insulated from each other and are surrounded by an example sheath 110 (e.g., an insulator). In the illustrated example, electric current flows through the wires 102, 104 (designated by a "•" in the wire 102 representing current coming out of the page toward the reader and an "X" in the wire 104 representing current going into the page away from the reader of FIG. 1) when the electronic device connected to the power cord 100 is drawing electricity (i.e., when it is powered on). In the illustrated example of FIG. 1, the electric current in the power cord 100 induces an example magnetic field 120.

Figure 2A:
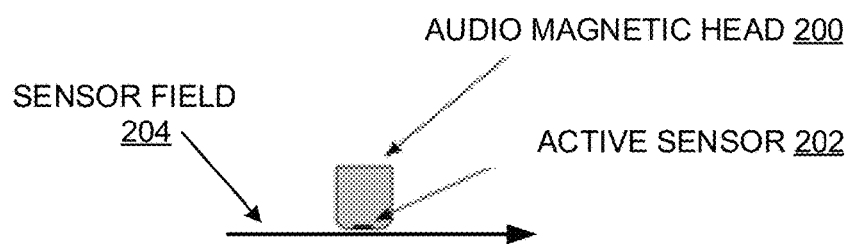
FIG. 2A illustrates a prior art sensor to measure a magnetic field.

FIG. 2A illustrates a magnetic head 200 that may be used to detect a magnetic field (e.g., the magnetic field 120). The magnetic head 200 uses an active sensor 202 that detects a magnetic field 204 that is tangential to the active sensor 202. For example, the magnetic head 200 may be an audio magnetic head such as one that was designed to read magnetic cassettes. When, the magnetic head 200 is placed in a magnetic field such that the active sensor 202 is tangential in space with the magnetic field 204, the magnetic field 204 may be sensed and/or measured. Accordingly, the magnetic head 200 measures only a scalar, one dimensional value of a magnetic field that is tangential to an active sensor of the magnetic head 200. However, because the active sensor 202 of the example magnetic head 200 can only measure a magnetic field 204 that is tangential to the active sensor 202, the magnetic head 200 must be carefully aligned to detect the magnetic field 204.

Figure 2B:
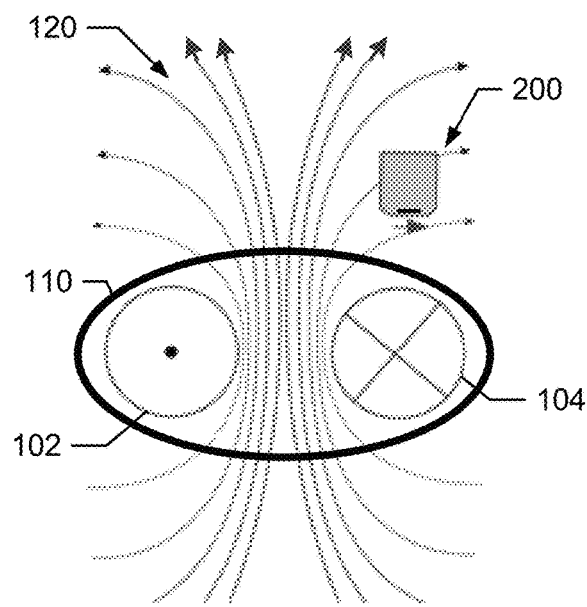
FIG. 2B illustrates the prior art sensor of FIG. 2A non-tangentially aligned with the magnetic field surrounding the power cord of FIG. 1.

FIG. 2B illustrates the example magnetic head 200 placed in the magnetic field 120 surrounding the example power cord 100 of FIG. 1. However, in the example of FIG. 2B, the magnetic head 200 is not tangentially oriented with the magnetic field 120. Accordingly, the active sensor 202 cannot accurately detect the magnetic field 120 and/or make an accurate measurement of the magnetic field 120. For example, due to the misalignment, the magnetic head 200 may not detect any measureable magnetic field despite the presence of the magnetic field 120.

Figure 2C:
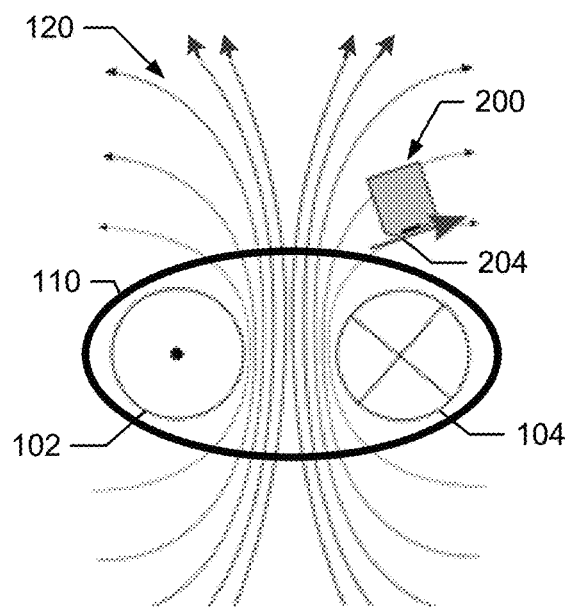
FIG. 2C illustrates the prior art sensor of FIG. 2A tangentially aligned with a portion of the magnetic field surrounding the power cord of FIG. 1.
Figure 3:
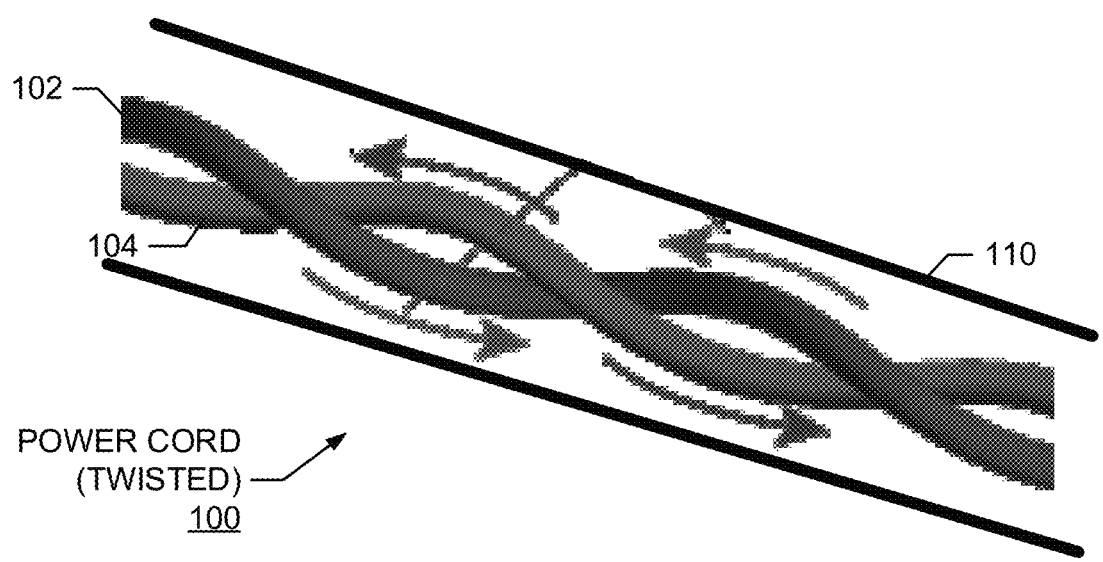
FIG. 3 is an isometric view of the example power cord of FIG. 1 in a twisted configuration.

FIG. 2C illustrates proper tangential alignment of the example magnetic head 200 and the magnetic field 120 such that the magnetic field 120 can be detected and/or measured by the magnetic head 200. As shown in the example of FIG. 2C, the magnetic field represented by arrow 204 is immediately adjacent the magnetic head 200 and, thus, can be sensed. Achieving the proper alignment illustrated in FIG. 2C may require several iterations of manual alignment adjustments. For example, occasionally the power cord 100 of FIGS. 1, 2B, and/or 2C is twisted and/or moved after placement of the magnetic head 200 as shown in FIG. 3. In some examples, the power cord 100 is manufactured such that the wires 102, 104 internal to the power cord 100 are in a twisted configuration (e.g., the wires 102, 104 internal to the power cord 100 are twisted around each other). When the power cord 100 is twisted or otherwise not uniform, the magnetic field 120 induced by the current flowing in the example power cord 100 follows the orientation of the wires. Accordingly, to accurately sense the magnetic field 120, an operator would need to properly realign the magnetic head 200 of FIGS. 2A-2C such that the active sensor 202 is tangentially aligned with the twisted magnetic field.

Methods, articles of manufacture, and/or apparatus to determine an operational status of a device are disclosed herein. An example method includes measuring a first magnetic field associated with a device by determining a first multi-dimensional vector indicative of the first magnetic field and determining an operational status of the device based on the vector. Some example methods, apparatus, and/or articles of manufacture also include measuring a second magnetic field to determine a second magnetic field vector and comparing the second magnetic field vector to the first magnetic field vector to determine an operational status of a device.

Figure 4:
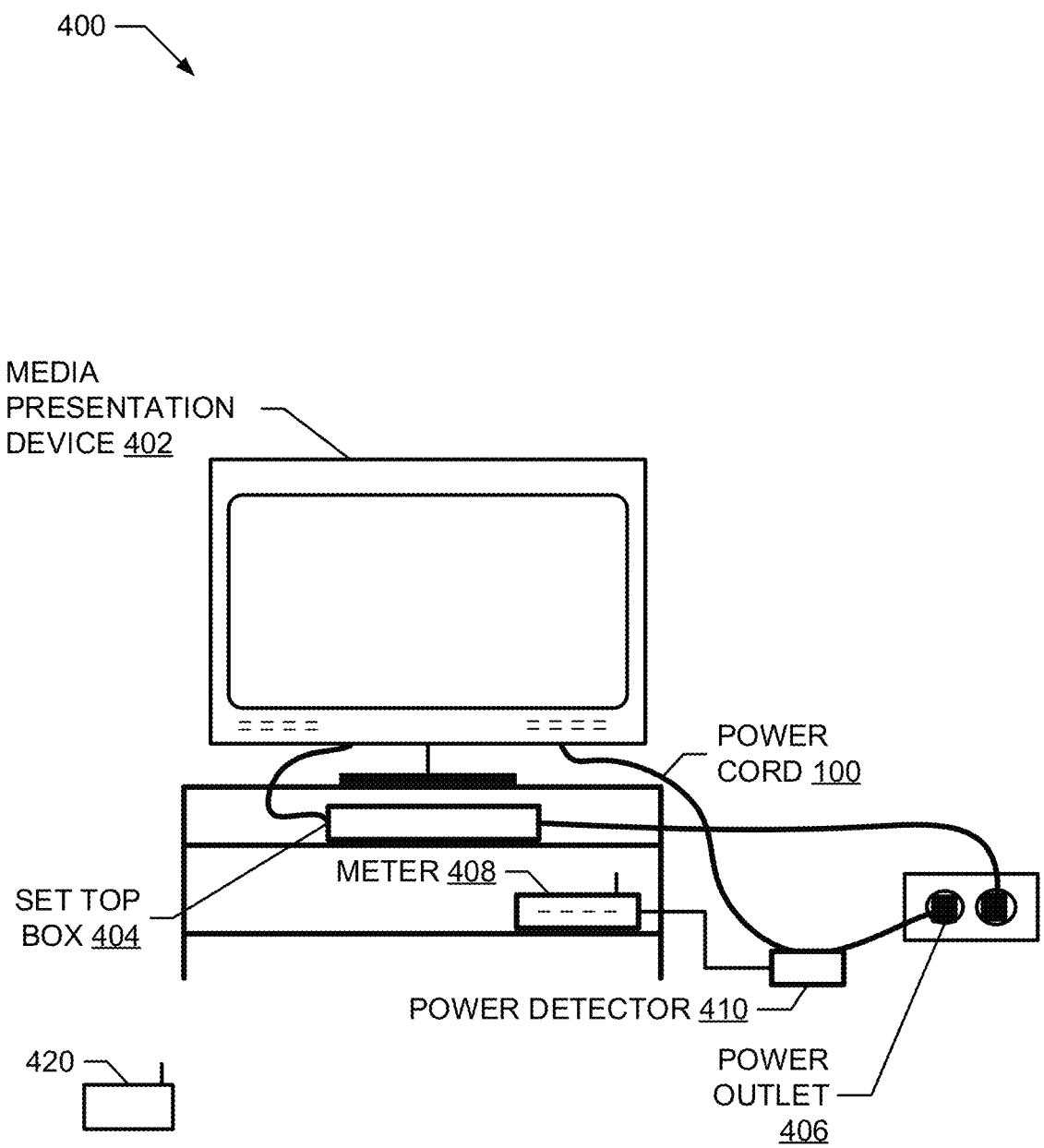
FIG. 4 illustrates an example system in which an example power detector constructed in accordance with the teachings of this disclosure is used to detect the operational status of a media presentation device.

FIG. 4 illustrates an example environment 400 in which an example power detector 410 constructed in accordance with the teachings of this disclosure is utilized to detect the operational status of a media presentation device 402. The example environment 400 of FIG. 4 includes an example media presentation device 402, an example set top box 404, and an example power outlet 406. In the example of FIG. 4, an example first meter 408 and an example second meter 420 are present for collecting audience measurement data. In the illustrated example of FIG. 4, the media presentation device 402 presents media provided via the set top box 404 and/or other media source(s) (e.g., a game console, an antenna, a mobile device (e.g., a smartphone, tablet computer, iPad, etc.) etc.). The example media presentation device 402 (e.g., a television, a monitor, etc.) of FIG. 1 is electrically connected to the power outlet 406 via an example power cord 100, which may be similar to the power cord 100 of FIGS. 1 and/or 3. The example outlet 406 is in electrical communication with a source of commercial power. When in the powered on state, the example media presentation device 402 of FIG. 4 draws electricity from the power outlet 406 (e.g., an outlet supplying 120 VAC or any other type of electricity) via the power cord 100.

The example power detector 410 of FIG. 4 detects and/or measures a magnetic field (e.g., the magnetic field 120 of FIG. 1) and/or an electric current associated with the magnetic field in accordance with the teachings of this disclosure. In the illustrated example of FIG. 4, the power detector 410 determines an operational status (e.g., powered on, powered off, on standby, in sleep mode, etc.) based on magnetic fields detected and/or measured within the system 400 (e.g., around the power cord 100). Although this disclosure refers to measuring magnetic field, it will be understood that measuring a magnetic field is a measure of the associated electric current and measuring an electric current is a measure of the corresponding magnetic field. Thus, whenever measuring a magnetic field is mentioned, it will be understood this can be done by measuring the corresponding electric current and vice versa. The example power detector 410 of FIG. 4 constructed in accordance with the teachings of this disclosure may be used as an alternative to the magnetic head 200 of FIGS. 2A-2C to determine the operational status of the media presentation device 402. In some examples, the power detector 410 detects and/or measures a magnetic field around the power cord 100 of the media presentation device 402, while in other examples, the power detector 410 detects and/or measures a magnetic field around a power cord of another device, such as the set top box 404 and/or other type of media presentation device. Additionally or alternatively, the power detector 410 (or a second power detector) may detect and/or measure magnetic field(s) around an audio cable and/or video cable connected to a media presentation device and/or connected to any other type of components to determine the operational status of the corresponding media presentation device.

The example first meter 408 of FIG. 4 is an example audience measurement device to measure the operational status of the media presentation device 402 and to transmit collected operational status information to a measurement entity. For example, the first meter 408 may upload operational status information reflecting the operational status of the monitored device via a network associated with the environment 400. In the illustrated example of FIG. 4, the power detector 410 provides operational status information reflecting the operational status of the monitored media presentation device 402 to the first meter 408. The first meter 408 of FIG. 4 stores the operational status information in a database of the first meter 408 until the operational status information is provided to the example audience measurement entity. In response to receiving operational status information indicating that the media presentation device 402 is powered on, the example first meter 408 sends a signal to the example second meter 420 (e.g., a personal meter, a portable meter, an on-device meter (ODM) of a mobile device, and/or other metering device) to indicate that the second meter 420 is to begin measuring audience information. In some examples, in response to determining the operational status information, the second meter 420 captures media identification information accompanying media presented via the media presentation device 402 to measure an audience of the presented media. For example, the second meter 120 may capture watermarks and/or codes associated with the presented media and/or generate signatures associated with the presented media. In some examples, the power detector 410 provides operational status information to the second meter 420 (e.g., via a wireless communication) and/or the first meter 408 is eliminated and its function is performed by the second meter 420. In some examples, the first meter 408 and the second meter 420 of FIG. 4 perform the same audience measurement operations. Accordingly, the example first meter 408 additionally or alternatively may capture media identification information (e.g., watermarks, codes, signatures, metadata, etc.).

In some examples, the first meter 408 and/or the second meter 420 of FIG. 4 detects media by capturing and/or detecting media identification information (e.g., watermarks, signatures, codes, etc.) associated with the presented media and embedded in audio and/or video of the media. Audio watermarking is a technique used to identify media such as television broadcasts, radio broadcasts, advertisements (television and/or radio), downloaded media, streaming media, prepackaged media, etc. Existing audio watermarking techniques identify media by embedding one or more audio codes (e.g., one or more watermarks), such as media identifying information and/or an identifier that may be mapped to media identifying information, into an audio and/or video component. In some examples, the audio or video component is selected to have a signal characteristic sufficient to hide the watermark. As used herein, the terms "code" or "watermark" are used interchangeably and are defined to mean any identification information (e.g., an identifier) that may be inserted or embedded in the audio or video of media (e.g., a program or advertisement) for the purpose of identifying the media or for another purpose such as tuning (e.g., a packet identifying header). As used herein "media" refers to audio and/or visual (still or moving) content and/or advertisements. To identify watermarked media, the watermark(s) are extracted and used to access a table of reference watermarks that are mapped to media identifying information.

Figure 5:
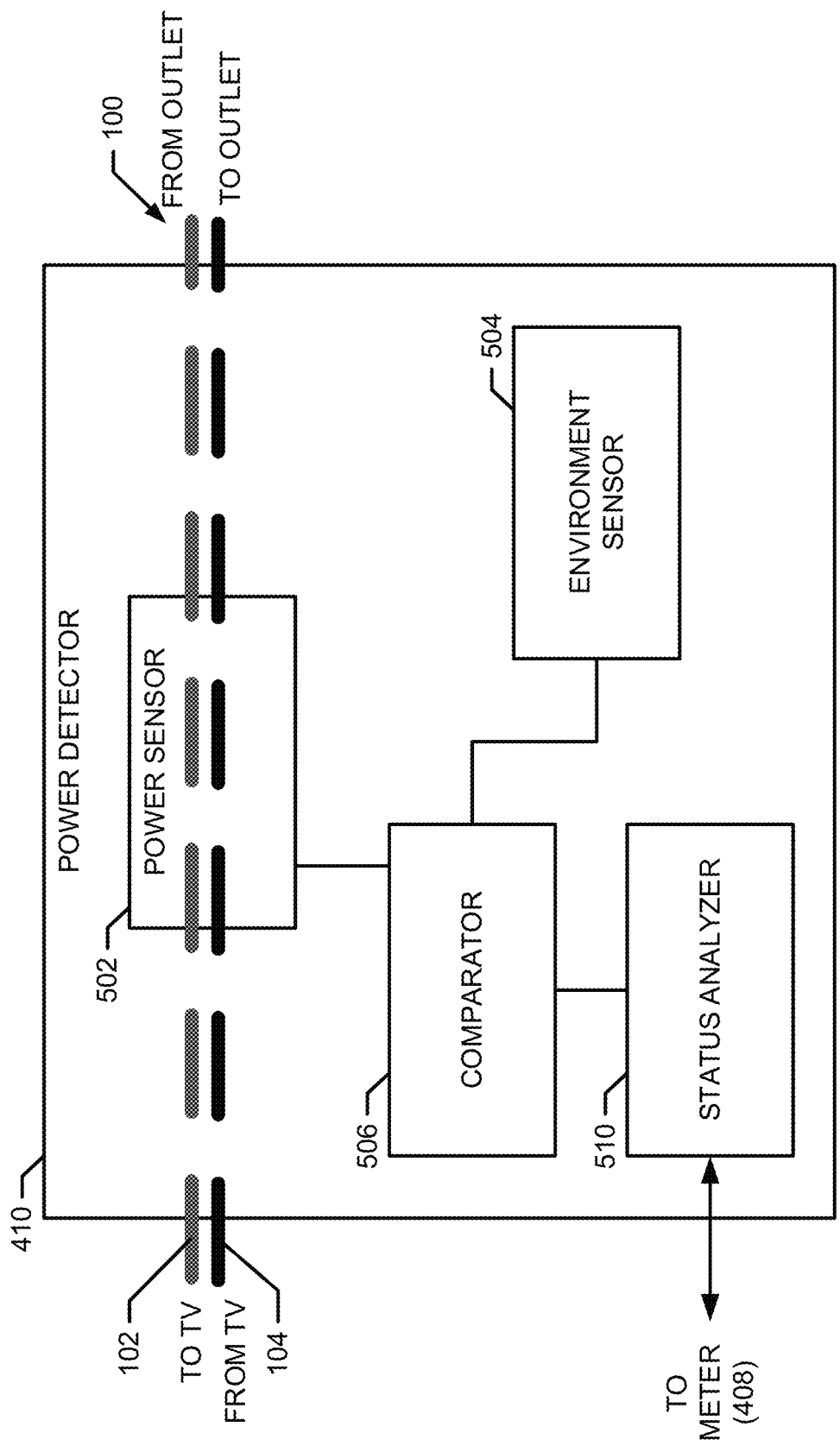
FIG. 5 is a block diagram of an example implementation of the example power detector of FIG. 4.

FIG. 5 is a block diagram of an example implementation of the example power detector 410 of FIG. 4. The example power detector 410 of FIG. 5 includes an example power sensor 502, an example environment sensor 504, an example comparator 506, and an example status analyzer 510. The example power detector 410 of FIG. 5 determines a magnetic field strength near the power sensor 502 (e.g., the magnetic field 120 surrounding the power cord 100) to determine the operational state of a device connected to the power cord 100.

The example power sensor 502 and the example environment sensor 504 of FIG. 5 respectively measure respective magnetic fields for a period of time (e.g., 0.5 seconds). The example power sensor 502 and the example environment sensor 504 of FIG. 5 detect and/or measure a respective magnetic field at the physical location of the corresponding sensors 502, 504 by sampling the magnetic field. For example, the power sensor 502 and the environment sensor 504 may measure respective magnetic fields at a given sampling frequency (e.g., 55 Hz). Accordingly, a plurality of samples (e.g., 11 samples for 50 Hz AC and for 60 Hz AC waveform, etc.) may be measured by the sensors 502, 504 to obtain a suitable magnetic field measurement. In such examples, the sensors 502, 504 measure a full sinusoidal waveform (e.g., one sampled sine period) of the measured magnetic fields.

In some examples, the power sensor 502 is implemented via a plurality of power sensors oriented such that a multi-dimensional measurement can be made from the plurality of power sensors (e.g., three sensors have different physical orientations to measure three components of a magnetic field). The measurement information of the power sensor 502 is provided to the comparator 506 for analysis.

In some examples, the environment sensor 504 is implemented via a plurality of environment sensors oriented such that a multi-dimensional measurement can be made from the plurality of environment sensors (e.g., three sensors have different physical orientations to measure three components of a magnetic field). The measurement information of the environment sensor 504 is provided to the comparator 506 for analysis.

In the illustrated example of FIG. 5, the power sensor 502 and the environment sensor 504 are implemented by similar devices (e.g., the power sensor 502 and the environment sensor 504 are implemented by a same model magnetometer from a same manufacturer). Each of the example power sensor 502 and the example environment sensor 504 of FIG. 5 are implemented by magnetometers (e.g., a vector magnetometer, a magnetoresistive magnetometer, etc.) that respectively measure magnetic fields in multiple dimensions surrounding the corresponding sensors 502, 504. Accordingly, the power sensor 502 multi-dimensionally measures the magnetic field near the power cord 100 and the environment sensor 504 multi-dimensionally measures the magnetic field of the environment. Freescale® MAG3110 sensors may be used to implement the example sensors 502, 504. For example, each of the sensors 502, 504 may respectively measure three dimensional (3D) components (e.g., an x-axis component, a y-axis component, and a z-axis component) of the respective magnetic fields.

Figure 6:
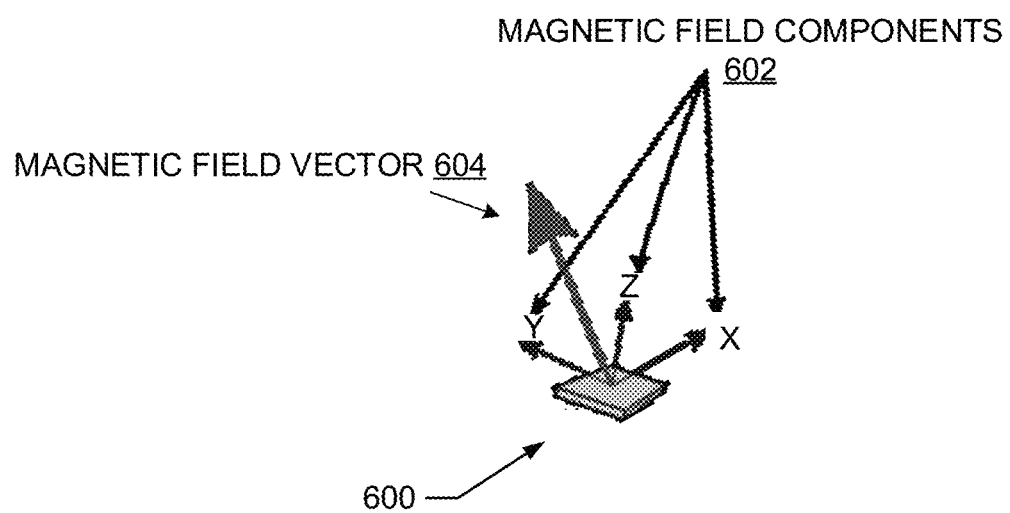
FIG. 6 illustrates an example sensor that may be utilized in the example power detector of FIGS. 4 and/or 5.

FIG. 6 illustrates an example 3D measurement collected by one of the sensors 502, 504. An example sensor 600 (which may be used to implement either of the sensors 502, 504 of FIG. 5) illustrated in FIG. 6 measures three magnetic field components 602 (x, y, z) of a magnetic field surrounding the sensor 600. In the illustrated example, the measured magnetic field components 602 are used to determine a magnetic field vector 604, which represents a magnitude and a direction of the measured magnetic field. Because the sensor 600 can measure the magnetic field surrounding the sensor in multiple dimensions (e.g., 3D) and determine a magnetic field vector of the magnetic field, the physical orientation of the sensor does not need to be tangential to the magnetic field to measure that magnetic field. In contrast, referring back to FIGS. 2A-2C, the magnetic head 200 measures only a scalar, one dimensional value of a magnetic field that is tangential to an active sensor of the magnetic head 200.

Returning to the illustrated example of FIG. 5, the power sensor 502 is physically located proximate to the power cord 100 such that a magnetic field induced by electricity flowing through the power cord 100 is detected. For example, the power sensor 502 and/or the power cord 100 of the illustrated example are within 5 millimeters of one another. In other examples, the power sensor 502 and the power cord 100 may be more than 5 millimeters apart (e.g., depending on the specifications of the power sensor 502). For illustrative purposes, dashed lines running through the power sensor block 502 represent example wires 102, 104 of the example power cord 100 of FIG. 4 running near or proximate the power sensor 502. The illustrated example wires 102, 104 are not components of the example power detector 410 of FIG. 5.

Figure 7:
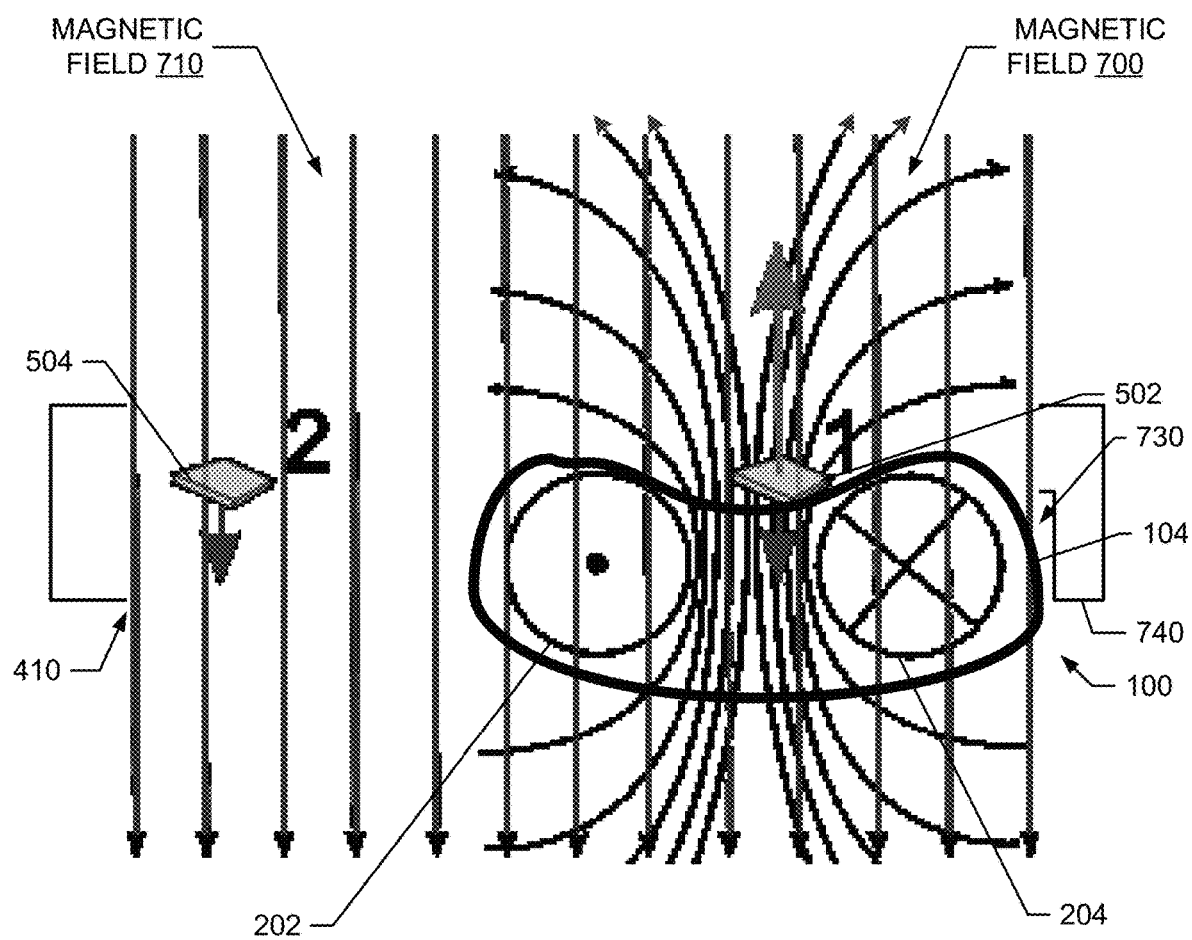
FIG. 7 illustrates an example magnetic field environment in which the example power detector of FIG. 4 may be used.

The example environment sensor 504 of FIG. 5 is physically located at a distance from the power cord 100 such that the magnetic field caused by the electricity flowing through the power cord 100 is essentially not detected (e.g., less than a threshold amount of the field is detected) and/or not included in the magnetic field measured by the environment sensor 504. As used herein, a first magnetic field essentially does not include a second magnetic field when the second magnetic field is immeasurable by a sensor (e.g., the environment sensor 504) within the first magnetic field, is not detectable by a sensor within the first magnetic field, has a magnetic field strength below a detectable threshold of a sensor when the sensor measures the first magnetic field, etc. For example the environment sensor 504 may be relatively distant (e.g., more than 5 millimeters, more than 10 millimeters, etc.) from the power sensor 502 and/or the power cord 100. FIG. 7, as described in further detail below, further illustrates this concept.

In the illustrated example, magnetic field measurements from the power sensor 502 and the environment sensor 504 are used to determine a magnetic field from the power cord 100. The example magnetic field measurements may be determined from a plurality of magnetic field measurement samples (e.g., 99 samples). The environment sensor 504 of the illustrated example measures an environment magnetic field of the environment of the power detector 410. For example, the environment magnetic field may be caused by the magnetic field of Earth, by other devices (e.g., the media presentation device 402, the set top box 404, the meter 408 of FIG. 4), and/or by other components (e.g., elements of logic circuits, processors, etc.) of the power detector 410. On the other hand, the example power sensor 502 measures that includes both the environment magnetic field and a magnetic field from the power cord 100. By subtracting the vector representation of the environment magnetic field from the magnetic field measured by the power sensor 502, the magnetic field generated by the power cord 100 can be determined. An example system in which an environment measurement is utilized is described in conjunction with FIG. 7.

The example power sensor 502 and the example environment sensor 504 of FIG. 5 provide their respective magnetic field measurements to the example comparator 506. Each of the magnetic field measurements include multi-dimensional magnetic field measurement components (e.g., values for each of the magnetic field components 602 (x, y, z)) that may be represented by a vector. In some examples, the magnetic field measurements may be a scalar magnitude and a direction, etc. In some examples, the example comparator 506 compares one or more magnetic field measurement vector(s) received from the power sensor 502 and/or the environment sensor 504 by subtracting the magnetic field measurement vector(s) of the environment sensor 504 from one or more corresponding magnetic field measurement vector(s) of the power sensor 502. In other examples, the comparator 506 subtracts magnetic field measurement components received from the environment sensor 504 from corresponding magnetic field measurement components received from the power sensor 502 on a dimension by dimension level. For example, in some such examples, an x-component of a vector from the environment sensor 504, is subtracted from an x-component of a vector from the power sensor 502, a y-component a of vector from the environment sensor 504 is subtracted from a y-component of a vector from the power sensor 502, and a z-component of a vector from the environment sensor 504 is subtracted from a z-component of a vector from the power sensor 502. The example comparator 506 of the illustrated example determines a device magnetic field vector measurement from the difference calculated from the corresponding component values.

In some examples, the comparator 506 performs a sample harmonization of a plurality of the compared magnetic field measurement samples to verify a magnetic field measurement. As an example, the sensors 502, 504 measure the magnetic field at an example sampling rate of 55 Hz for a period of time (e.g., 1.8 seconds) to generate the plurality of magnetic field measurement samples. The example comparator 506 subtracts the magnetic field measurement samples of the environment sensor 504 from the magnetic field measurement samples of the power sensor 502 as described above. Accordingly, at a sampling rate of 55 Hz for electric current having a frequency of 50 Hz or 60 Hz and flowing through the power cord 100, the comparator 506 measures at least eleven samples to provide enough samples for a magnetic field measurement, which, in this example, is at least one full sinusoidal period of the AC electric current. Furthermore, during an example 1.8 second time period, the sensors 502, 504 may measure nine 50 Hz or 60 Hz sinusoidal periods (from 99 samples). In some examples, the comparator 506 averages the sinusoidal periods and/or corresponding magnetic field measurement samples of the sinusoidal periods to determine a magnetic field measurement. The example comparator 506 may adjust (e.g., in response to a user input or other settings) a number of magnetic field measurement samples taken and/or a length of the period of time used to measure the magnetic field. For example, if the operational status of a device is to be determined more frequently, less magnetic field measurement samples and/or a shortened period of time may be used to measure the magnetic field near the power cord 100. On the other hand, to increase accuracy, more magnetic field measurement samples may be taken or a longer period of time may be used to measure the magnetic field near the power cord 100.

In some examples, if the magnetic field measurement indicates an unexpected measurement (e.g., due to a false measurement, due to noise, etc.), then the comparator 506 may determine that the magnetic field measurement is not to be used to determine the operational status of the device. Additionally or alternatively, the comparator 506 of FIG. 5 performs a root mean square (RMS) analysis of the calculated device magnetic field vectors for magnetic field measurement samples resulting from subtracting the vectors measured by the environment sensors 504 from the vectors measured by the power sensor 502 (e.g., eleven for 50 Hz and 60 Hz AC). For example, for 11 periods of 50 Hz or 60 Hz AC, the RMS calculation for an x-coordinate component of the magnetic field measurement vector may be:

$$x_{RMS} = \sqrt{\frac{1}{11}(X_1^2 + X_2^2 + \cdots + X_{11}^2)}$$

where $x_n$ is a sample x-coordinate component of a magnetic field measurement. The example comparator 506 performs the RMS analysis to determine a magnitude of a vector value of a device magnetic field. In some examples, the comparator 506 filters the RMS value using an infinite impulse response (IIR) filter to lower value fluctuations and relatively maintain an accurate device magnetic field measurement for low electric current. Ultimately, in the illustrated example of FIG. 5, the comparator 506 determines the vector value of the device magnetic field induced by electricity in the power cord 100 (e.g., exclusive of the environment magnetic field).

In to the illustrated example of FIG. 5, the physical orientation of the power sensor 502 and the environment sensor 504 are the same or substantially the same. For example, one or more axis (axes) of the power sensor 502 is aligned (e.g. planar) with corresponding axis (axes) of the environment sensor 504. Thus, in the illustrated example, the power sensor 502 and the environment sensor 504 are oriented in in the same manner in one or more same plane(s). In some examples, when the power sensor 502 and the environment sensor 504 do not have the same orientation (e.g., one or both of the sensors 502, 504 are off-axis, the sensors 502, 504 are not in a same plane, etc.), the comparator 506 of the power detector 410 may perform a calibration technique to account for the different orientation. For example, the comparator 506 may determine the physical orientation of the power sensor 502 and the environment sensor 504 and adjust the respective measurements form the sensors 502, 504 based on the orientations of the sensors. In some examples, the comparator 506 may calculate an average value of a magnetic field measurement (e.g., a sinusoidal period) and if a non-zero value is found, the non-zero value may be subtracted from the magnetic field measurement samples (e.g., to remove a DC field and obtain relatively pure AC field values).

In the illustrated example of FIG. 5, the comparator 506 provides the device magnetic field measurements to the status analyzer 510. The example status analyzer 510 of FIG. 5 determines an operational status of a device (e.g., the media presentation device 402 of FIG. 4) based on the device magnetic field measurement. In some examples, the status analyzer 510 determines that the operational status of the device is powered on when a vector value of the device magnetic field measurement satisfies a threshold. For example if a magnitude of the vector value associated with the magnetic field 120 from the power cord 100 of FIG. 4 satisfies a first threshold (e.g., is equal to or above a given value), the status analyzer 510 determines that the media presentation device 402 is powered on. In some examples, the status analyzer 510 determines that the operational status of the device is powered off when a device magnetic field is not detected and/or when a vector value of the device magnetic satisfies a second threshold (e.g., a magnitude of the device magnetic field vector is below the second threshold). In some examples, the status analyzer 510 determines an operational status (e.g., stand by, sleep mode, etc.) when the vector value of the device magnetic field satisfies two or more thresholds (e.g., is above the second threshold of the above example and below the first threshold of the above example). For example, the status analyzer 510 may determine that the media presentation device 402 is in a sleep mode when a magnitude of the vector value is between the first threshold and the second threshold.

In some examples, the status analyzer 510 includes an interface to communicate with one or more external devices (e.g., the first meter 408, the second meter 420, etc.). In some examples, the status analyzer 510 is responsive to request (e.g., from the meters 408, 420) to determine an operational status of a device (e.g., the media presentation device 402). In some such examples, the status analyzer 510 prompts the power sensor 502 and/or the environment sensor 504 to take respective magnetic field measurements at the respective locations of the sensors 502, 504. In some examples, the status analyzer 510 provides operational status information indicating the operational status of an analyzed device (e.g., the media presentation device 402) to one or more external devices, such as the meters 408, 420 and/or other devices in communication with the power detector 410. In some examples, the status analyzer 510 transmits the operational status information through a communication network (e.g., the Internet or other network) to a data collection facility (e.g., a data server managed by an audience measurement entity).

While an example manner of implementing the power detector 410 of FIG. 4 is illustrated in FIG. 5, one or more of the elements, processes and/or devices illustrated in FIG. 5 may be combined, divided, re-arranged, omitted, eliminated and/or implemented in any other way. Further, the example power sensor 502, the example environment sensor 504, the example comparator 506, the example status analyzer 510 and/or, more generally, the example power detector 410 of FIG. 5 may be implemented by hardware, software, firmware and/or any combination of hardware, software and/or firmware. Thus, for example, any of the example power sensor 502, the example environment sensor 504, the example comparator 506, the example status analyzer 510 and/or, more generally, the example power detector 410 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example power sensor 502, the example environment sensor 504, the example comparator 506, and/or the example status analyzer 510 is/are hereby expressly defined to include a tangible computer readable storage device or storage disk such as a memory, a digital versatile disk (DVD), a compact disk (CD), a Blu-ray disk, etc. storing the software and/or firmware. Further still, the example power detector 410 of FIG. 4 may include one or more elements, processes and/or devices in addition to, or instead of, those illustrated in FIG.

5, and/or may include more than one of any or all of the illustrated elements, processes and devices.

FIG. 7 illustrates an example transverse view of an example power detector 410, which may be implemented by the power detector 410 of FIGS. 4 and/or 5, and an axial view of the example power cord 100. In the illustrated example of FIG. 7, a device magnetic field 700 is induced by electricity flowing through the power cord 100 and an environment magnetic field 710 is caused by environmental effects (e.g., the earth magnetic field, a magnetic field from other devices not under measurement near the power detector 410, a magnetic field induced by other components of the power detector 410, etc.). In the illustrated example of FIG. 7, the power cord 100 is positioned in an example slot 730 of an example housing 740 of the power detector 410. The example slot 730 is positioned above the power sensor 502 and may be used to hold the example power cord 100 in position adjacent the power sensor 502. Accordingly, the power sensor 502 is located physically near the power cord 100 and the environment sensor 504 is located relatively distant from the power sensor 502 and/or the power cord 100. As shown in the illustrated example, the power sensor 502 is located within the device magnetic field 700 induced by the electricity flowing through the power cord 100 (e.g., a magnetic field similar to the magnetic field 120 of FIGS. 1, 2B, and/or 2C) and is also located in the environment magnetic field 710. In the illustrated example of FIG. 7, the environment sensor 504 is physically located within the environment magnetic field 710 and outside of the device magnetic field 700. Therefore, in the illustrated example of FIG. 7, the power sensor 502 is able to detect and/or measure the device magnetic field 700 and the environment sensor 504 is not influenced (e.g., is influenced to a small extent that can be ignored for practical purposes) by the device magnetic field 700.

In the illustrated example of FIG. 7, the power sensor 502 samples the magnetic field 700 near the power cord 100 and the environment sensor 504 samples the magnetic field 710 of the environment. Accordingly, as described above, the comparator 506 subtracts the magnetic field measurements of the magnetic field 710 (from the environment sensor 504) from the magnetic field measurements of the magnetic field 700 (from the power sensor 502) to determine the magnetic field induced by the electric current flowing through the power cord 100. The example comparator 506 of the example power detector 410 performs a sample harmonization of the magnetic field measurement samples from the power sensor 502 and the environment sensor 504. Additionally or alternatively, the comparator 506 performs an RMS calculation of the compared measurement vectors from the resulting subtraction.

Figure 8:
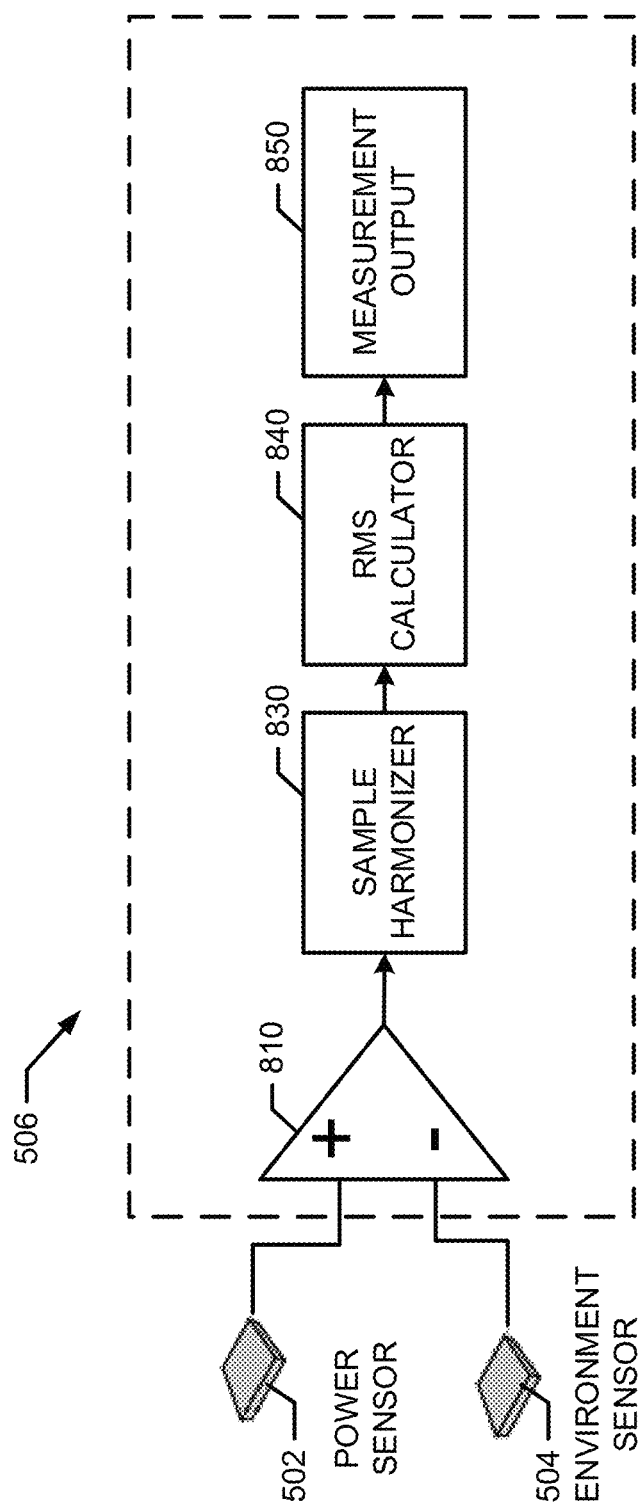
FIG. 8 is a block diagram representative of an example implementation of an example comparator of the example power detector of FIGS. 4 and/or 5.

FIG. 8 is a block diagram of an example comparator 506 receiving measurement information from the example sensors 502, 504. The example comparator 506 of FIG. 8 may be used to implement the comparator 506 of FIG. 5. The example comparator 506 of FIG. 8 includes an example subtractor 810, an example sample harmonizer 830, an example RMS calculator 840, and an example measurement output 850.

The example subtractor 810 of FIG. 8 subtracts the magnetic field measurement samples received from the environment sensor 504 from the magnetic field measurement samples received from the power sensor 502 to determine device magnetic field measurement samples representative of the device magnetic field measurement (e.g., a magnetic field measurement excluding the environment magnetic field measurement).

The example sample harmonizer 830 of FIG. 8 performs a sample harmonization of the device magnetic field measurement samples as disclosed herein. Accordingly, the sample harmonizer 830 averages corresponding sample values of the sinusoidal periods to determine a final device magnetic field measurement vector (e.g., a full averaged sinusoidal period from measured sinusoidal periods). The example RMS calculator 840 performs a RMS calculation of the resulting measurement vector over the samples of each dimension of the vector to determine a magnitude of the measurement vector. The example measurement output 850 indicates a magnetic field strength based on the magnitude of the device magnetic field vector. The example measurement output 850 provides the device magnetic field vector to the status analyzer 510 of FIG. 5. Accordingly, the status analyzer 510 of FIG. 5 may compare the magnetic field strength to a threshold to determine an operational status of a device (e.g., the media presentation device 402 of FIG. 4) based on the measurements of the comparator 506 of FIG. 8.

Figure 9:
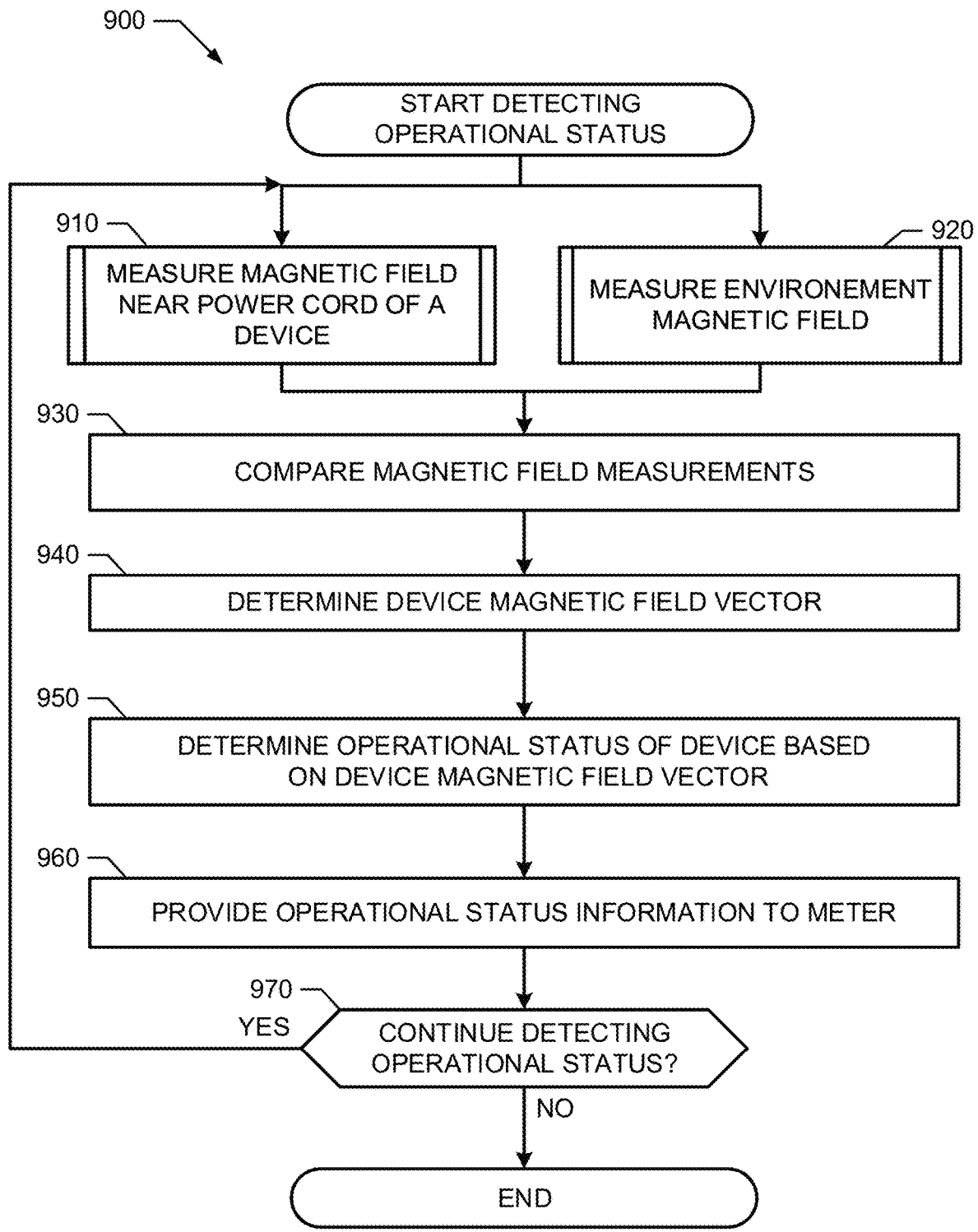
FIG. 9 is a flowchart representative of example machine readable instructions that may be executed to implement the example power detector of FIG. 5.

A flowchart representative of example machine readable instructions for implementing the power detector 410 of FIGS. 4 and/or 5 is shown in FIG. 9. In this example, the machine readable instructions comprise a program for execution by a processor such as the processor 1312 shown in the example processor platform 1300 discussed below in connection with FIG. 13. The program may be embodied in software stored on a tangible computer readable storage medium such as a CD-ROM, a floppy disk, a hard drive, a digital versatile disk (DVD), a Blu-ray disk, or a memory associated with the processor 1312, but the entire program and/or parts thereof could alternatively be executed by a device other than the processor 1312 and/or embodied in firmware or dedicated hardware. Further, although the example program is described with reference to the flowchart illustrated in FIG. 9, many other methods of implementing the example power detector 410 may alternatively be used. For example, the order of execution of the blocks may be changed, and/or some of the blocks described may be changed, eliminated, or combined.

The program of FIG. 9 begins with an initiation of the power detector 410 of FIGS. 4 and/or 5 (e.g., the power detector 410 is powered on, connected to a meter such as the meters 408, 420, receives user input, etc.). At block 910, the power sensor 502 measures a magnetic field near a power cord, such as the power cord 100 of FIG. 4, of a device, such as the media presentation device 402. At block 920 the environment sensor 504 measures the environment magnetic field. Block 920 may occur before, after, or at the same time as block 910. The example power sensor 502 measures a magnetic field (block 910) as described below in connection with FIG. 10. Additionally, the example environment sensor 504 measures a magnetic field (block 920) as described below in connection with FIG. 10.

At block 930 of FIG. 9, the example comparator 506 compares the magnetic field measurements from block 910 and block 920. In some examples, the comparator 506 performs calibration of the magnetic field measurements based on the physical orientation of the power sensor 502 and/or the physical orientation of the environment sensor 504. In some examples, the example comparator 506 subtracts the environment magnetic field measurement taken in block 920 from the measurement of the magnetic field near the power cord taken in block 910. At block 940, the comparator 506 determines a resultant magnetic field representative of the magnetic field induced by the power cord 100 of an example device. For example, the comparator 506 calculates one or more vector(s) from the compared magnetic field measurement components of the magnetic fields measured in blocks 910, 920.

At block 950 of FIG. 9, the example status analyzer 510 determines an operational status of the example device based on the determined device magnetic field vector. In some examples, the status analyzer 510 determines the operational status (e.g., powered on, powered off, on standby, in sleep mode, etc.) of a device based on a magnitude of the device magnetic field vector satisfying one or more thresholds. Accordingly, thresholds may be used to determine the operational status when the magnitude is between a plurality of thresholds. The example thresholds may be determined when setting up (or calibrating the power detector 410). For example, the media presentation device 402 may be set to a plurality of operational states (e.g., powered off, powered on, on standby, in sleep mode, etc.), and the comparator 506 determines the device magnetic field for when the media presentation is in the plurality of states. Accordingly, from the determined device magnetic field measurements, the status analyzer 510 may assign the appropriate thresholds (e.g., within a designated range (or percentage to allow for error) of the measured magnetic field strength for the corresponding operational states). As an example, the status analyzer 510 may determine that the corresponding operational status is powered off when the magnitude is less than a sleep threshold, is in sleep mode when the magnitude is less than a stand by threshold, on standby when the magnitude is less than a powered on threshold, and powered on when the magnitude is greater than the powered on threshold. In some examples, the status analyzer 510 uses predefined thresholds for the media presentation device 402. Accordingly, the thresholds may be predefined for certain types of media presentation device (e.g., based on manufacture, model, device type, etc.).

In the illustrated example of FIG. 9, at block 960, the status analyzer 510 provides the operational status information to a meter (e.g., the meters 408, 420) or other device communicatively coupled with the power detector 410. At block 970, the power detector 410 determines whether to continue detecting the operational status of the device under test. If the power detector 410 is to continue detecting the operational status of the device, control returns to block 910 and/or block 920 (e.g., a time period of analyzing the device under test has not expired, instructions from a meter indicate that analysis is to continue, user instructions indicate that analysis is to continue, etc.). If the power detector 410 is not to continue detecting the operational status of the device (e.g., a time period of analyzing the device under test has expired, the power detector 110 is shutdown or powered off, etc.), the program 900 ends.

Figure 10:
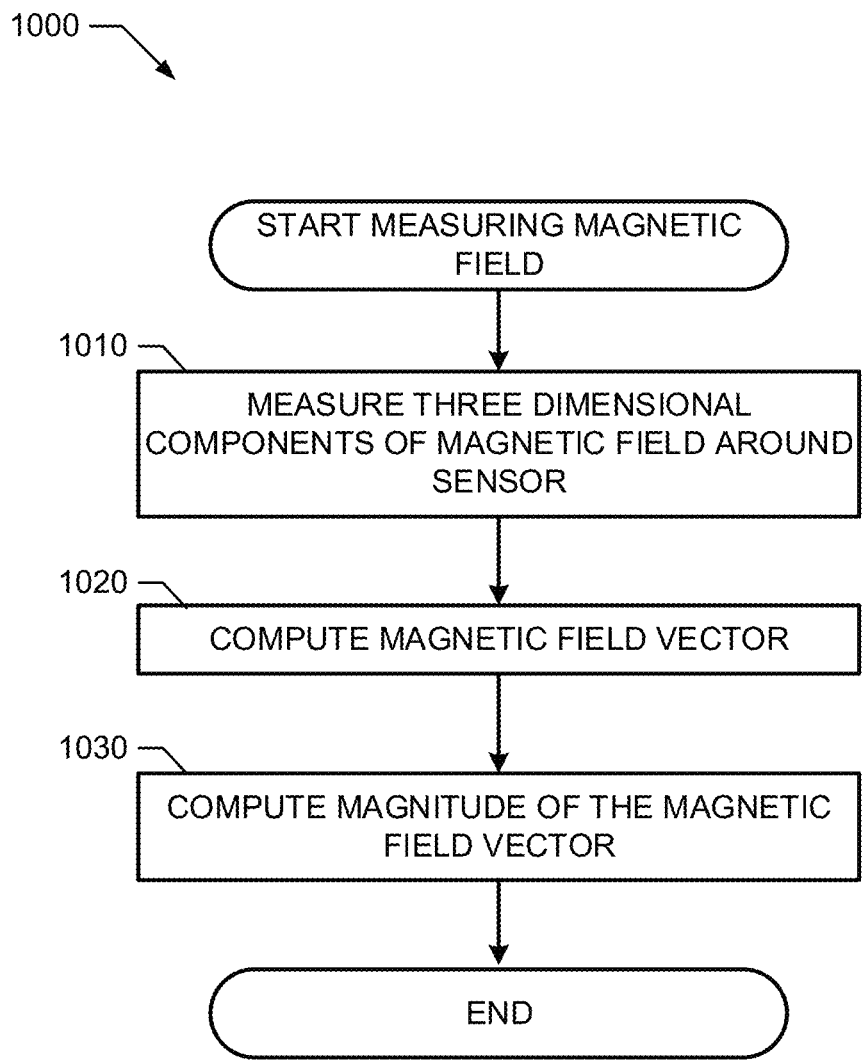
FIG. 10 is a flowchart representative of example machine readable instructions that may be executed to implement one or more example sensor(s) of FIG. 5 and/or the example sensor of FIG. 6.

A flowchart representative of example machine readable instructions for implementing the power sensor 502 and/or the environment sensor 504 of FIG. 5 is shown in FIG. 10. In this example, the machine readable instructions comprise a program for execution by a processor such as the processor 1312 shown in the example processor platform 1300 discussed below in connection with FIG. 13. The program may be embodied in software stored on a tangible computer readable storage medium such as a CD-ROM, a floppy disk, a hard drive, a digital versatile disk (DVD), a Blu-ray disk, or a memory associated with the processor 1312, but the entire program and/or parts thereof could alternatively be executed by a device other than the processor 1312 and/or embodied in firmware or dedicated hardware. Further, although the example program is described with reference to the flowchart illustrated in FIG. 10, many other methods of implementing the example power sensor 502 and/or the example environment sensor 504 may alternatively be used. For example, the order of execution of the blocks may be changed, and/or some of the blocks described may be changed, eliminated, or combined.

The program 1000 of FIG. 10 beings with an initiation of the power sensor 502 and/or the environment sensor 504. At block 1010, the power sensor 502 and/or the environment sensor 504 measure three dimensional components of a magnetic field around the power sensor 502 and/or the environment sensor 504. At block 1020, the power sensor 502 and/or the environment sensor 504 computes a magnetic field vector from the 3D components (e.g., the components 602 (x, y, z)). At block 1030, the sensor determines the magnitude of the field vector based on the determined 3D components.

Figure 11:
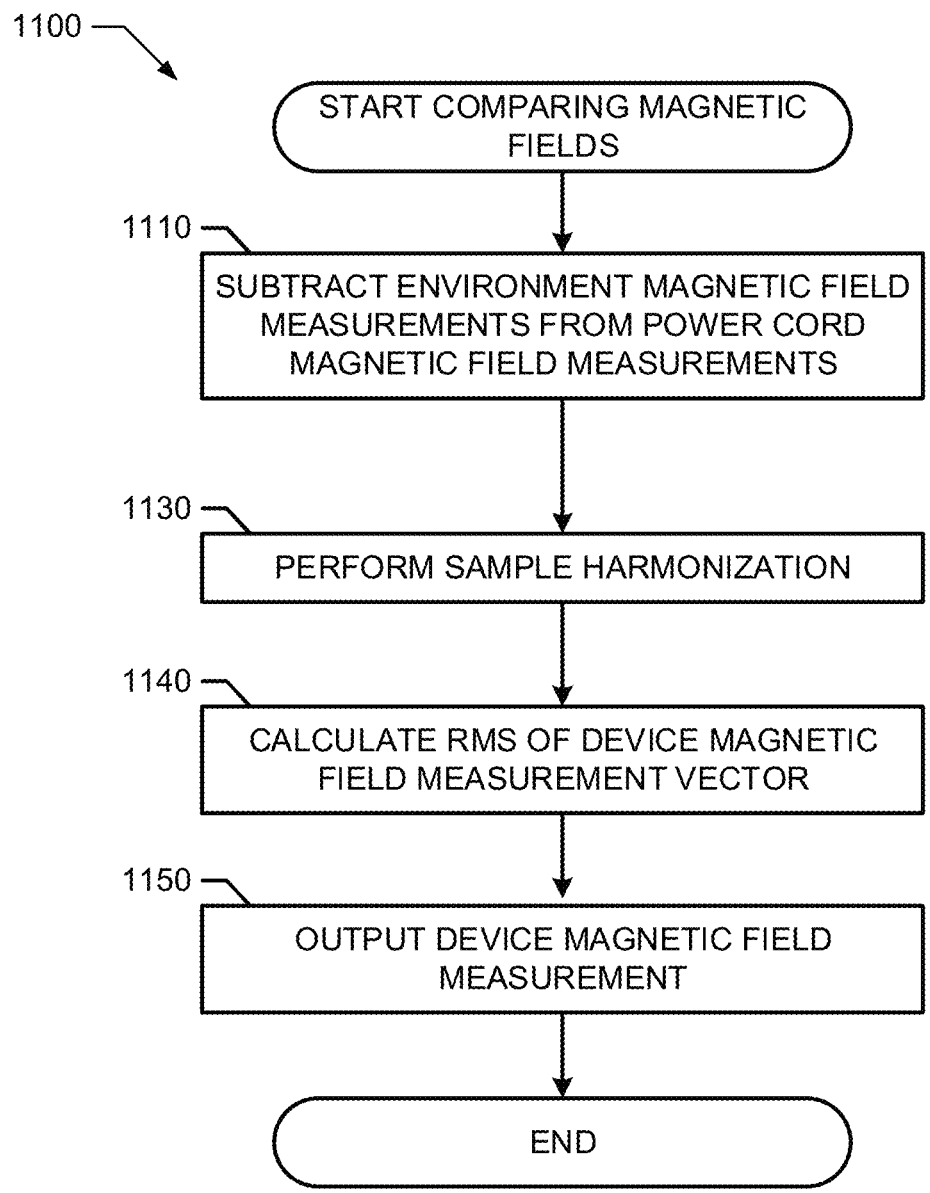
FIG. 11 is a flowchart representative of example machine readable instructions that may be executed to implement the example comparator of FIG. 8.

A flowchart representative of example machine readable instructions for implementing the comparator 506 of FIGS. 5 and/or 8 is shown in FIG. 11. In this example, the machine readable instructions comprise a program for execution by a processor such as the processor 1312 shown in the example processor platform 1300 discussed below in connection with FIG. 13. The program may be embodied in software stored on a tangible computer readable storage medium such as a CD-ROM, a floppy disk, a hard drive, a digital versatile disk (DVD), a Blu-ray disk, or a memory associated with the processor 1312, but the entire program and/or parts thereof could alternatively be executed by a device other than the processor 1312 and/or embodied in firmware or dedicated hardware. Further, although the example program is described with reference to the flowchart illustrated in FIG. 11, many other methods of implementing the example comparator 506 may alternatively be used. For example, the order of execution of the blocks may be changed, and/or some of the blocks described may be changed, eliminated, or combined.

The program 1100 of FIG. 11 begins with an initiation of the example comparator 506 of FIG. 5 (e.g., in response to receiving measurements and/or measurement samples from the power sensor 502 and/or environment sensor 504). At block 1110, the subtractor 810 subtracts environment magnetic field measurement samples (received from the environment sensor) from power cord magnetic field measurement samples (received from the power sensor 502) to determine device magnetic field measurement samples. In some examples, at block 1110 the subtractor 810 calculates an average value of each sample period determined from the device magnetic field measurement samples. If a non-zero average is found (i.e., a DC field is detected), the sample harmonizer 830 subtracts the non-zero average from the sample periods to obtain AC field sample periods.

At block 1130 of the illustrated example of FIG. 11, the sample harmonizer 830 performs a filtering and averaging of the samples. The example sample harmonizer 830 averages each sample from a sample period with the corresponding samples from the other remaining periods. For example, for 50 Hz or 60 Hz AC, with 99 samples taken by the power sensor 502 and the environment sensor 504, the sample harmonizer 830 averages 11 sample values from each of the determined 9 sample periods (and/or averages each sample for each axis (x, y, z)).

At block 1140, the RMS calculator 840 performs an RMS calculation over the device magnetic field measurement vector for each dimension of the multi-dimensional sample measurement. The RMS calculator 840 determines the magnitude of the determined device magnetic field vector. At block 1150, the measurement output 1150 outputs the device magnetic field measurement information to the status analyzer 510. After block 1150, the program 1100 ends.

As mentioned above, the example processes of FIGS. 9, 10, and/or 11 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example processes of FIGS. 9, 10, and/or 11 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

Figure 12:
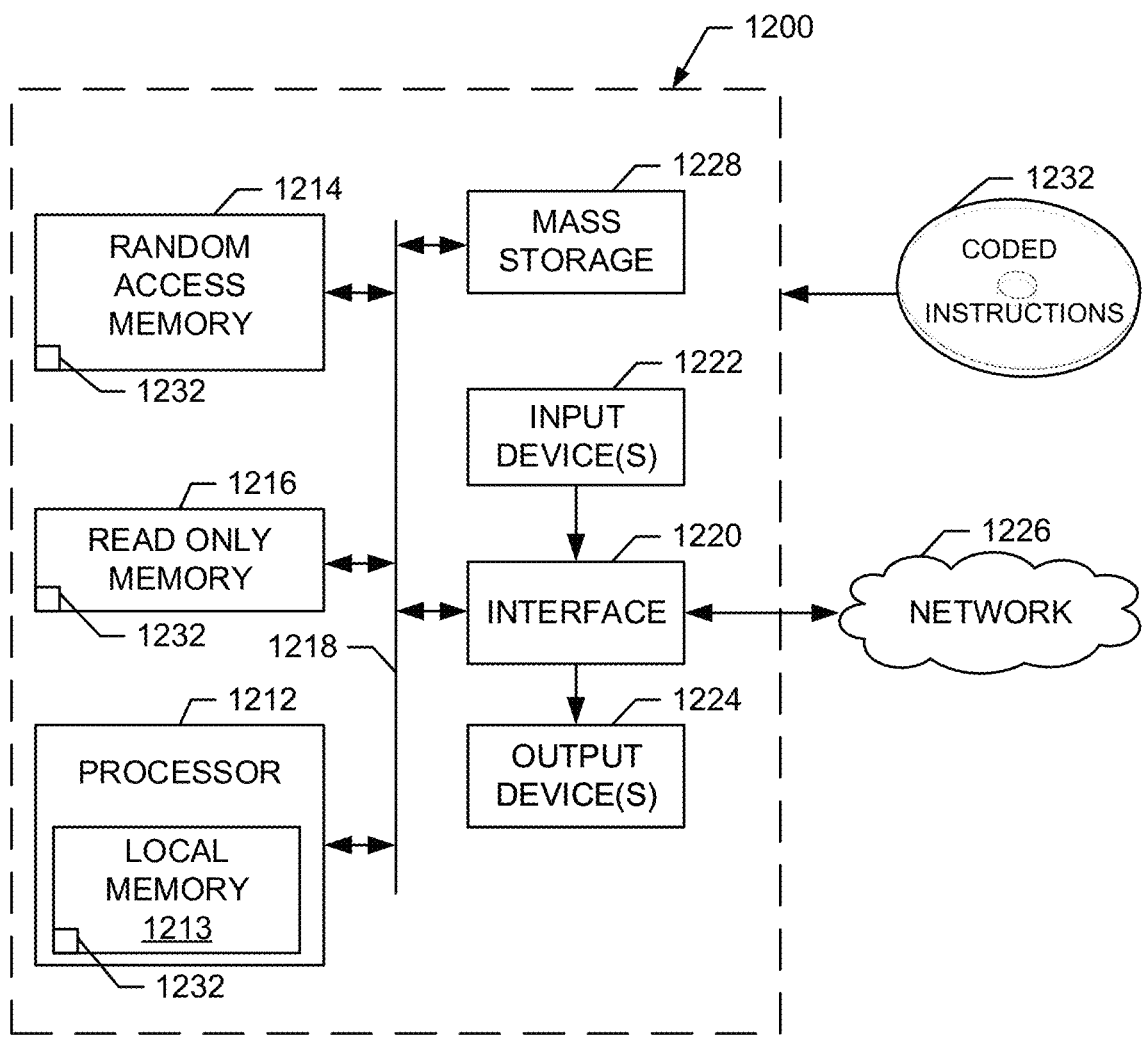
FIG. 12 is a block diagram of an example processing platform capable of executing the machine readable instructions of FIGS. 9, 10, and/or 11 to implement the example power detector of FIGS. 4 and/or 5 and/or the example comparator of FIG. 8.

FIG. 12 is a block diagram of an example processor platform 1300 capable of executing the instructions of FIGS. 9, 10, and/or 11 to implement the power detector 410 of FIGS. 4 and/or 5 and/or the comparator 506 of FIG. 8. The processor platform 1200 can be, for example, a server, a personal computer, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, or any other type of computing device.

The processor platform 1200 of the illustrated example includes a processor 1212. The processor 1212 of the illustrated example is hardware. For example, the processor 1212 can be implemented by one or more integrated circuits, logic circuits, microprocessors or controllers from any desired family or manufacturer.

The processor 1212 of the illustrated example includes a local memory 1213 (e.g., a cache). The processor 1212 of the illustrated example is in communication with a main memory including a volatile memory 1214 and a non-volatile memory 1216 via a bus 1218. The volatile memory 1214 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1216 may be implemented by flash memory and/or any other desired type of memory device. Access to the main memory 1214, 1216 is controlled by a memory controller.

The processor platform 1200 of the illustrated example also includes an interface circuit 1220. The interface circuit 1220 may be implemented by any type of interface standard, such as an Ethernet interface, a universal serial bus (USB), and/or a PCI express interface.

In the illustrated example, one or more input devices 1222 are connected to the interface circuit 1220. The input device(s) 1222 permit(s) a user to enter data and commands into the processor 1212. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1224 are also connected to the interface circuit 1220 of the illustrated example. The output devices 1224 can be implemented, for example, by display devices (e.g., a light emitting diode (LED), an organic light emitting diode (OLED), a liquid crystal display, a cathode ray tube display (CRT), a touchscreen, a tactile output device, a light emitting diode (LED), a printer and/or speakers). The interface circuit 1220 of the illustrated example, thus, typically includes a graphics driver card, a graphics driver chip or a graphics driver processor.

The interface circuit 1220 of the illustrated example also includes a communication device such as a transmitter, a receiver, a transceiver, a modem and/or network interface card to facilitate exchange of data with external machines (e.g., computing devices of any kind) via a network 1226 (e.g., an Ethernet connection, a digital subscriber line (DSL), a telephone line, coaxial cable, a cellular telephone system, etc.).

The processor platform 1200 of the illustrated example also includes one or more mass storage devices 1228 for storing software and/or data. Examples of such mass storage devices 1228 include floppy disk drives, hard drive disks, compact disk drives, Blu-ray disk drives, RAID systems, and digital versatile disk (DVD) drives.

The coded instructions 1232 of FIGS. 9, 10, and/or 11 may be stored in the mass storage device 1228, in the volatile memory 1214, in the non-volatile memory 1216, and/or on a removable tangible computer readable storage medium such as a CD or DVD.

From the foregoing, it will be appreciated that the above disclosed methods, apparatus and articles of manufacture determine an operational status of a device based on a measured magnetic field associated with the device. In examples disclosed herein, sensors perform multi-dimensional measurement of magnetic fields surrounding a power cord attached to the device. Multi-dimensionally measuring example magnetic fields surrounding a device allows for freedom of positioning the sensors such that, for example, distorted magnetic fields (e.g., caused by one or more twist(s) in the power cord) can be measured. Examples disclosed herein allow for increased accuracy in measuring a device magnetic field by accounting for environment magnetic fields that may affect measurement of a device magnetic field by measuring the environment magnetic field and comparing the environment magnetic field to a magnetic field measured near a power cord of a device.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A method, comprising:
   measuring a first magnetic field, the first magnetic field including a device magnetic field caused by a wire attached to a device to supply electricity to the device;
   measuring a second magnetic field associated with an environment at least a first distance from the wire, the first distance from the wire to ensure the second magnetic field, when measured, does not include the device magnetic field;
   comparing the first magnetic field and the second magnetic field to determine an operational status of the device; and
   collecting audience measurement data based at least in part on the operational status of the device.

2. The method as defined in claim 1, further including comparing the first magnetic field and the second magnetic field by subtracting a second measurement measured by a second sensor from a first measurement measured by a first sensor to determine a device magnetic field vector.

3. The method as defined in claim 1, further including performing a sample harmonization of a first plurality of magnetic field measurements from a first sensor and a second plurality of magnetic field measurements from a second sensor measured over a first time period.

4. The method as defined in claim 3, further including selecting the first time period to include at least a first sinusoidal period and a second sinusoidal period of an alternating current in the wire.

5. The method as defined in claim 4, further including performing the sample harmonization by averaging ones of the first plurality of magnetic field measurements from the first sinusoidal period with corresponding magnetic field measurements from the second sinusoidal period.

6. The method as defined in claim 1, further including performing a root mean squared (RMS) calculation of a plurality of magnetic field measurements resulting from first vectors measured by a first sensor and second vectors measured by a second sensor over a first time period.

7. The method as defined in claim 6, wherein the RMS calculation is performed for the plurality of magnetic field measurements in respective ones of a plurality of dimensions.

8. The method as defined in claim 6, further including filtering RMS values using an infinite response filter.

9. The method as defined in claim 1, further including measuring, using a first sensor, the first magnetic field associated with the wire in a plurality of dimensions and measuring, using a second sensor, the second magnetic field in a plurality of dimensions.

10. The method as defined in claim 1, further including measuring, using a first sensor, the first magnetic field associated with the wire in a plurality of dimensions and measuring, using a second sensor, the second magnetic field in a plurality of dimensions.

11. An apparatus, comprising:
   a first measurement means to measure a first magnetic field, the first magnetic field including a device magnetic field caused by a wire attached to a device to supply electricity to the device;
   a second measurement means to measure a second magnetic field associated with an environment at least a first distance from the wire, the first distance from the wire to ensure the second magnetic field, when measured, does not include the device magnetic field;
   comparing means to compare the first magnetic field and the second magnetic field to determine an operational status of the device; and
   collection means to collect audience measurement data based at least in part on the operational status of the device.

12. The apparatus as defined in claim 11, wherein the comparing means further include comparing the first magnetic field and the second magnetic field by subtracting a second measurement measured by a second sensor from a first measurement measured by a first sensor to determine a device magnetic field vector.

13. The apparatus as defined in claim 11, further including harmonizer means to harmonize a first plurality of magnetic field measurements from a first sensor and a second plurality of magnetic field measurements from a second sensor measured over a first time period.

14. The apparatus as defined in claim 13, further including selecting means to select the first time period to include at least a first sinusoidal period and a second sinusoidal period of an alternating current in the wire.

15. The apparatus as defined in claim 14, wherein the means to harmonize further include averaging ones of the first plurality of magnetic field measurements from the first sinusoidal period with corresponding magnetic field measurements from the second sinusoidal period.

16. The apparatus as defined in claim 11, further including root mean squared (RMS) calculator means to perform a root means squared (RMS) calculation of a plurality of magnetic field measurements resulting from first vectors measured by a first sensor and second vectors measured by a second sensor over a first time period.

17. A tangible computer readable storage medium comprising instructions that, when executed, cause a processor to at least:
   measure a first magnetic field, the first magnetic field including a device magnetic field caused by a wire attached to a device to supply electricity to the device;
   measure a second magnetic field associated with an environment at least a first distance from the wire, the first distance from the wire to ensure the second magnetic field, when measured, does not include the device magnetic field;
   compare the first magnetic field and the second magnetic field to determine an operational status of the device; and
   collect audience measurement data based at least in part on the operational status of the device.

18. The storage medium according to claim 17, wherein the instructions cause the processor to compare the first magnetic field and the second magnetic field by subtracting a second measurement measured by a second sensor from a first measurement measured by a first sensor to determine a device magnetic field vector.

19. The storage medium according to claim 17, wherein the instructions cause the processor to perform a sample harmonization of a first plurality of magnetic field measurements from a first sensor and a second plurality of magnetic field measurements from a second sensor measured over a first time period.

20. The storage medium according to claim 19, wherein the instructions cause the processor to select the first time period to include at least a first sinusoidal period and a second sinusoidal period of an alternating current in the wire.

* * * * *